US010553795B2

(12) United States Patent
Kang et al.

(10) Patent No.: US 10,553,795 B2
(45) Date of Patent: Feb. 4, 2020

(54) FLEXIBLE DISPLAY DEVICE MANUFACTURING METHOD AND MANUFACTURING APPARATUS

(71) Applicant: Samsung Display Co., Ltd., Yongin-si, Gyeonggi-Do (KR)

(72) Inventors: Byunghoon Kang, Yongin-si (KR); Seungjun Moon, Yongin-si (KR); Heekyun Shin, Yongin-si (KR); Minwoo Lee, Yongin-si (KR); Woojin Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/128,711

(22) Filed: Sep. 12, 2018

(65) Prior Publication Data

US 2019/0165272 A1   May 30, 2019

(51) Int. Cl.
*H01L 51/00* (2006.01)
*H01L 27/32* (2006.01)
*H01L 51/52* (2006.01)
*B32B 43/00* (2006.01)
*H01L 51/56* (2006.01)

(52) U.S. Cl.
CPC .......... *H01L 51/003* (2013.01); *B32B 43/006* (2013.01); *H01L 27/3244* (2013.01); *H01L 51/0097* (2013.01); *H01L 51/5253* (2013.01); *H01L 51/56* (2013.01); *B32B 2457/20* (2013.01); *H01L 2227/326* (2013.01); *H01L 2251/5338* (2013.01)

(58) Field of Classification Search
CPC ...................................... H01L 51/00
See application file for complete search history.

(56) References Cited

U.S. PATENT DOCUMENTS

| 6,451,670 B1 | 9/2002 | Takisawa et al. |
| 2015/0021631 A1 | 1/2015 | Huh et al. |
| 2015/0314302 A1 | 11/2015 | Dalton |
| 2017/0073493 A1 | 3/2017 | Lovis et al. |

FOREIGN PATENT DOCUMENTS

| JP | 2010-269580 A | 12/2010 |
| KR | 10-0396014 B1 | 8/2003 |
| KR | 10-2013-0142404 A | 12/2013 |
| KR | 10-1460913 B1 | 11/2014 |
| WO | WO 2015/169705 A1 | 11/2015 |

*Primary Examiner* — Marvin Payen
(74) *Attorney, Agent, or Firm* — Kile Park Reed & Houtteman PLLC (57) ABSTRACT

A method of manufacturing a flexible display apparatus includes forming a flexible substrate on a carrier substrate, forming a display on a central portion of the flexible substrate, forming a protection layer covering the display, within an area of the flexible substrate, such that an edge portion of the flexible substrate is exposed outside of the protection layer, cutting a first edge portion of the flexible substrate that is exposed outside of the protection layer, except for a second remaining portion of the flexible substrate that is exposed outside of the protection layer, applying suction to the second portion of the flexible substrate, and separating the carrier substrate from the flexible substrate.

20 Claims, 6 Drawing Sheets

FLEXIBLE DISPLAY DEVICE MANUFACTURING METHOD AND MANUFACTURING APPARATUS

CROSS-REFERENCE TO RELATED APPLICATION

Korean Patent Application No. 10-2017-0161004, filed on Nov. 28, 2017, in the Korean Intellectual Property Office, and entitled: "Flexible Display Device Manufacturing Method and Manufacturing Apparatus," is incorporated by reference herein in its entirety.

BACKGROUND

1. Field

Embodiments relate to a method and apparatus for manufacturing a flexible display device.

2. Description of the Related Art

Display devices such as organic light-emitting display devices may have a small thickness and flexibility due to their driving characteristics, and thus research has been actively conducted on such display devices.

SUMMARY

Embodiments are directed to a method of manufacturing a flexible display apparatus, the method including forming a flexible substrate on a carrier substrate, forming a display on a central portion of the flexible substrate, forming a protection layer covering the display, within an area of the flexible substrate, such that an edge portion of the flexible substrate is exposed outside of the protection layer, cutting a first edge portion of the flexible substrate that is exposed outside of the protection layer, except for a second remaining portion of the flexible substrate that is exposed outside of the protection layer, applying suction to the second portion of the flexible substrate, and separating the carrier substrate from the flexible substrate.

The method may further include forming a low-adhesive layer between the carrier substrate and the flexible substrate.

The low-adhesive layer may have an adhesion ranging from about 1 gf/inch to about 5 gf/inch.

The method may further include applying lower suction to the protection layer when the suction is applied to the second portion of the flexible substrate.

The suction applied to the protection layer may be less than or equal to half of the suction applied to the second portion of the flexible substrate.

The method may include adjusting a location where the suction is applied to the second portion of the flexible substrate.

In the separating of the carrier substrate, the carrier substrate may be pulled so as to be separated from the flexible substrate while being held parallel to the flexible substrate.

In the separating of the carrier substrate, one end of the carrier substrate may be pulled first to separate the carrier substrate from the flexible substrate from the one end of the carrier substrate towards another end of the carrier substrate.

The cutting of the edge portion may be performed by using any one of contact cutting using a cutting wheel and non-contact cutting using a laser beam.

The flexible substrate may include a polyimide material, and the carrier substrate may include a glass material.

Embodiments are also directed to an apparatus for manufacturing a flexible display device having a protection layer covering a display on a flexible substrate, the apparatus including a first suction section configured to apply suction to the protection layer, and a second suction section configured to apply suction to a carrier substrate, which is coupled to the flexible substrate, on a side opposite to the display and pull and separate the carrier substrate from the flexible substrate, The first suction section may include a low-pressure section configured to apply relatively low suction to the protection layer over the display, and a high-pressure section configured to apply relatively high suction to an edge portion of the flexible substrate extending beyond the display and exposed outside the protection layer.

The high-pressure section may be separate from the low-pressure section, and distances between the high-pressure section and the low-pressure section may be adjustable.

The second suction section may include a reciprocating driver configured to move the carrier substrate in a direction in which the suction power of the first suction section is applied, and in an opposite direction, and a tilt driver configured to pull one side of the carrier substrate to tilt the carrier substrate.

The apparatus may further include a cutting section configured to cut edge portions of the flexible substrate.

The cutting section may include any one of a cutting wheel and a laser irradiator.

A low-adhesive layer may be arranged between the carrier substrate and the flexible substrate, and when the carrier substrate is separated from the flexible substrate by the first and second suction sections, the low-adhesive layer may be separated from the flexible substrate together with the carrier substrate.

The low-adhesive layer may have an adhesion ranging from about 1 gf/inch to about 5 gf/inch.

The suction of the low-pressure section may be less than or equal to half of the suction of the high-pressure section.

The suction of the high-pressure section may be in inverse proportion to an area of the edge portion.

The flexible substrate may include a polyimide material, and the carrier substrate may include a glass material.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 1:
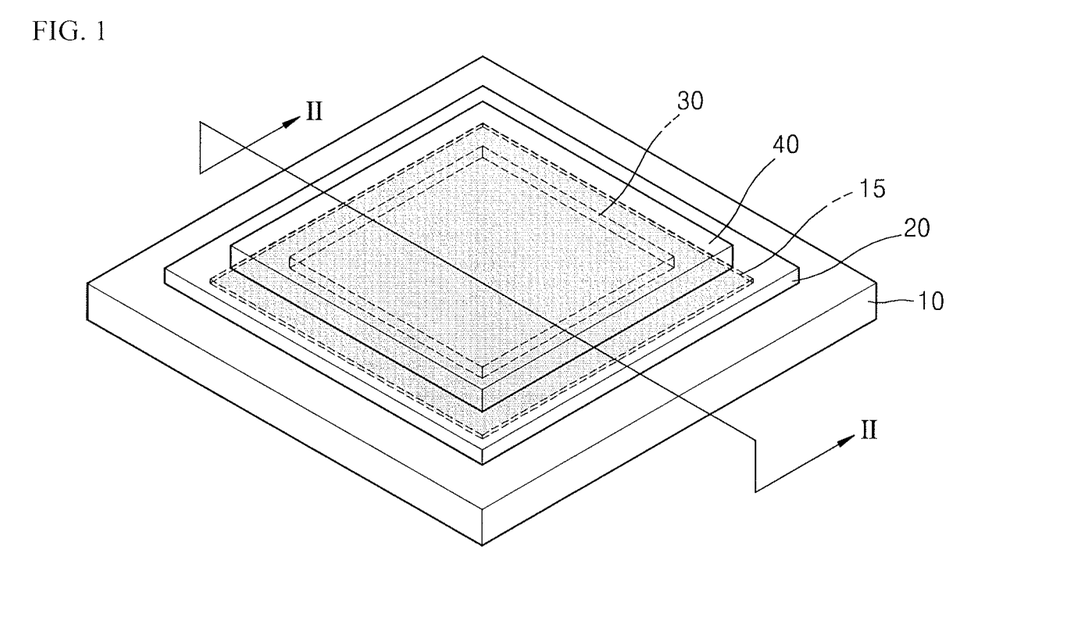
FIG. 1 illustrates a perspective view of a coupling state of a carrier substrate of a flexible display device manufactured by using a manufacturing method, according to an example embodiment.
Figure 2:
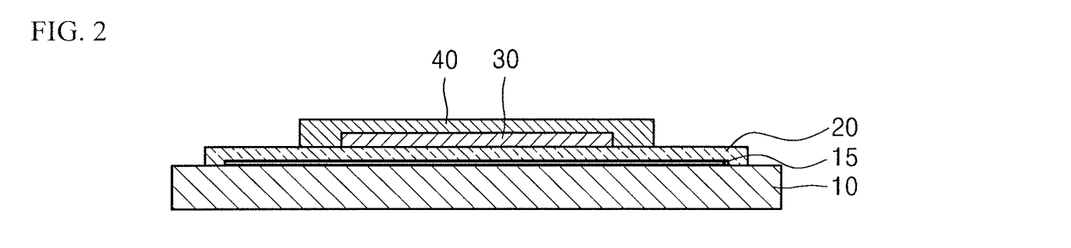
FIG. 2 illustrates a cross-sectional view taken along a line II-II of FIG. 1.

FIGS. 1 and 2 respectively illustrate a perspective view and a cross-sectional view of a coupling state of a carrier substrate 10 of a flexible display device that is manufactured by using a manufacturing method, according to an example embodiment.

Referring to FIGS. 1 and 2, the flexible display device according to the present example embodiment has a structure in which a flexible substrate 20 (for example, including polyimide), a display 30 for displaying an image, and a protection layer 40 covering and protecting the display 30 are stacked. The protection layer 40 may protect the display 30 from external impact or penetration of external moisture.

The flexible display device may have a flexible structure in which the display 30 is sealed by the protection layer 40 including a thin film and the flexible substrate 20 that is ultra-thin and includes polyimide, instead of a thick and rigid glass substrate. Compared to a structure in which top and bottom surfaces of the display 30 are surrounded by a thick glass substrate, the flexible display device having the flexible structure may have highly increased flexibility and may display images while a screen is bent.

It may be difficult to handle the flexible substrate 20 due to flexibility thereof. Thus, the flexible substrate 20 may be formed on the rigid carrier substrate 10 (for example, including a glass material) and transported therewith during the manufacture of the flexible display device. After the protection layer 40 is formed, the flexible substrate 20 and the carrier substrate 10 may be separated from each other.

Figure 7:
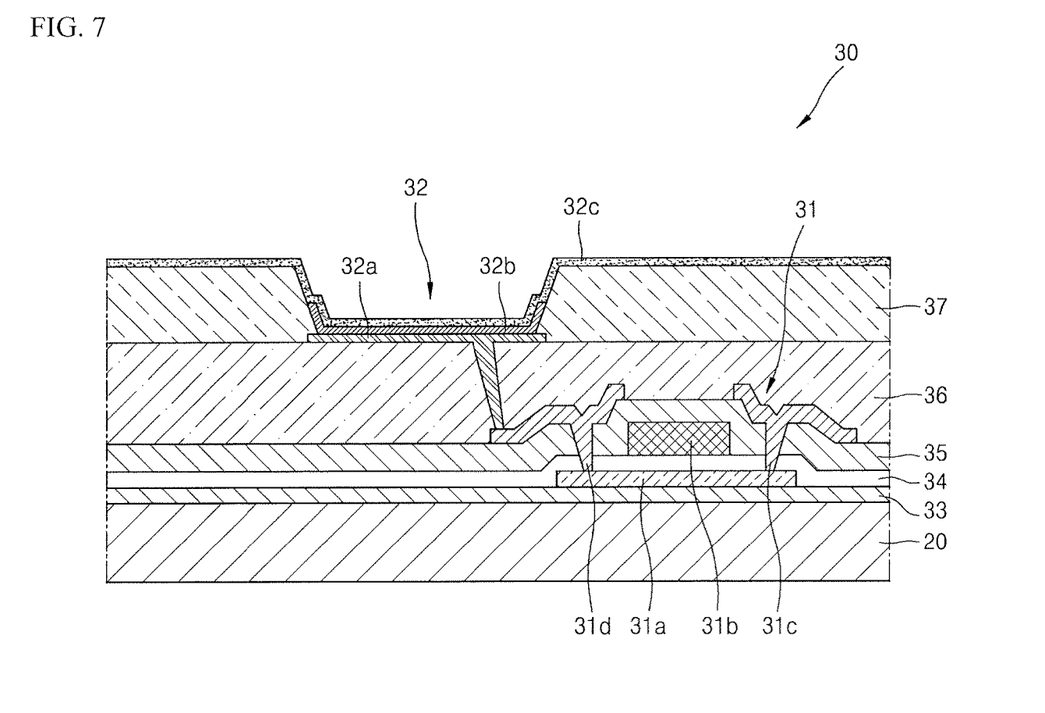
FIG. 7 illustrates a cross-sectional view of an internal structure of a display of the flexible display device of FIG. 1.

The display 30 displays images, and an internal structure thereof may be, for example, a structure illustrated in FIG. 7.

Referring to FIG. 7, in an example embodiment, the display 30 may include a buffer layer 33 formed on the flexible substrate 20, and a thin film transistor 31 and an organic light-emitting device 32 formed above the buffer layer 33.

The thin film transistor 31 may include an active layer 31a, a gate insulating layer 34 covering the active layer 31a, and a gate electrode 31b on the gate insulating layer 34.

An interlayer insulating layer 35 may cover the gate electrode 31b, and a source electrode 31c and a drain electrode 31d may be formed on the interlayer insulating layer 35.

The source electrode 31c and the drain electrode 31d may respectively contact a source area and a drain area of the active layer 31a through contact holes formed in the gate insulating layer 34 and the interlayer insulating layer 35.

A pixel electrode 32a of the organic light-emitting device 32 may be connected to the drain electrode 31d. The pixel electrode 32a may be formed on a planarization layer 36, and a pixel-defining layer 37 defining sub-pixel areas may be formed on the pixel-defining electrode 32a. An emission layer 32b of the organic light-emitting device 32 may be formed above an opening in the pixel-defining layer 37, and an opposite electrode 32c may be deposited over the emission layer 32b and the pixel-defining layer 37. Thus, the opening surrounded by the pixel-defining layer 37 may become an area of one sub-pixel such as a red pixel R, a green pixel G, or a blue pixel B, and the emission layer 32b emitting a corresponding color may be formed in the area of the sub-pixel. FIG. 7 illustrates one sub-pixel, but in the actual display 30, multiple sub-pixels may be arranged in a row direction and a column direction.

Referring again to FIGS. 1 and 2, a release layer may be provided. The release layer may be, for example, a low-adhesive layer 15, which may have an adhesion ranging from, for example, about 1 gf/inch to 5 gf/inch, and may allow the carrier substrate 10 and the flexible substrate 20, which have been adhered to each other at an appropriate viscosity, to be separated from each other using low power.

Figure 3:
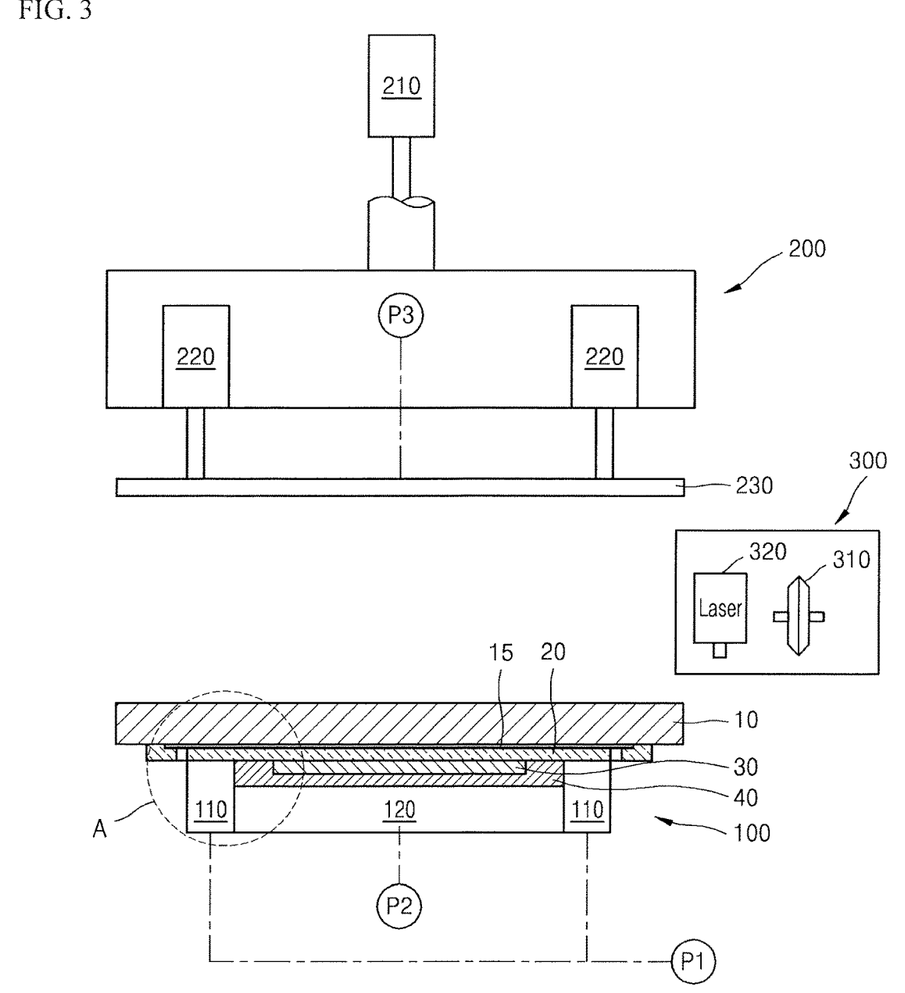
FIG. 3 illustrates a front view of an apparatus for manufacturing a flexible display device, according to an example embodiment.

As a device for separating the carrier substrate 10 from the flexible display device (in which the carrier substrate 10, the flexible substrate 20, and the protection layer 40 are formed), an apparatus for manufacturing a flexible display device illustrated in FIG. 3 may be used according to an example embodiment.

Referring to FIG. 3, the apparatus may include a suction section 200 that sucks and pulls the carrier substrate 10 at the top of the apparatus, and a suction section 100 that sucks and holds the protection layer 40 at the bottom of the apparatus, which work together for the separation of the carrier substrate 10.

Hereinafter, the suction section 100 at the bottom of the apparatus will be referred to as the first suction section 100, and the suction section 200 at the top of the apparatus will be referred to as the second suction section 200.

The apparatus may be configured to cut a first part of the flexible substrate 20 that is exposed outside the protection layer 40, except for a second portion of the flexible substrate 20 that is exposed outside of the protection layer 40, which is not cut. The apparatus may apply suction power to the second, remaining portion of the flexible substrate 20, and separate the carrier substrate 10 from the flexible substrate 20.

According to the present example embodiment, the first suction section 100 may include a low-pressure section 120. The first suction section may also include a high-pressure section 110 that applies suction power to portions of the flexible substrate 20 that are not covered by the protection layer 40 and thus are exposed. In an implementation, a plurality of high suction sections 110 may be provided.

The high-pressure section 110 may hold the flexible substrate 20 so that the flexible substrate is not pulled during the separation of the carrier substrate 10. The low-pressure section 120 may suck or pull the protection layer 40 at a relatively low pressure compared to pressure applied by the high-pressure section 110.

Figure 4:
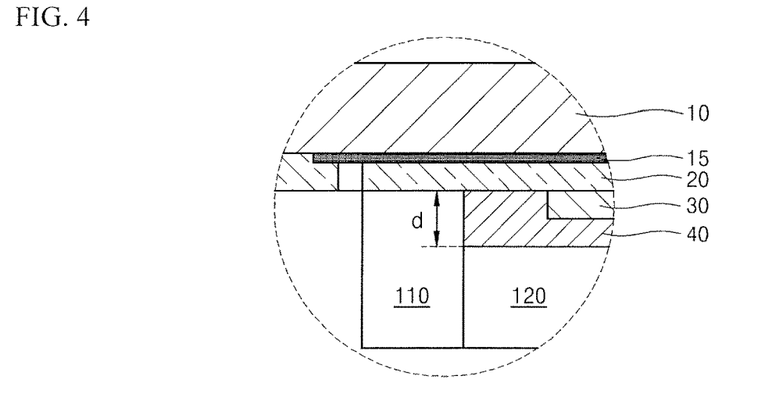
FIG. 4 illustrates an enlarged diagram of a portion A of FIG. 3.

Referring to the inset in FIG. 3 and its enlargement in FIG. 4, the low-pressure section 120 may apply suction power to the protection layer 40 covering the display 30. The high-pressure section 110 may apply suction power to portions of the flexible substrate 20 that are not covered by the protection layer 40 and thus are exposed.

In further detail, referring to FIGS. 3 and 4, the high-pressure section 110 may directly suck and fix narrow edge portions of the flexible substrate 20 that are exposed outside the protection layer 40. During a process of separating the carrier substrate 10, outermost extending edge portions of the flexible substrate 20, that is, portions that directly contact the carrier substrate 10 outside the low adhesive layer 15, may be cut by a cutter 300, and then remaining extending portions of the flexible substrate 20 may be sucked by the high-pressure section 110. Thus, the high-pressure section 110 may suck portions that are much narrower than the exposed edge portions of the flexible substrate 20 illustrated in FIG. 1. Further details of the manufacturing processes including the cutting process are described below.

In FIG. 3, the reference character P1 indicates a first pump that may apply negative pressure to a suction hole (not shown) of the high-pressure section 110. The negative pressure of the high-pressure section 110 may be in inverse proportion to an area of the remaining portions that are sucked by the high-pressure section 110.

The low-pressure section 120 may suck the protection layer 40 at a relatively low pressure compared to pressure applied by the high-pressure section 110. For example, when the high-pressure section 110 applies pressure of about 70 kPa to the remaining portions of the flexible substrate 20, the low-pressure section 120 may drive a second pump P2 and apply, to the protection layer 40, a pressure of about 35 kPa or less that is one-half of the pressure of the high-pressure section 110.

Application of the same level of pressure to the protection layer 40 by the low-pressure section 120 as that applied to the flexible substrate 20 by the high-pressure section 110 may cause exfoliation or delamination during the separation of the carrier substrate 10. Thus, in the present example embodiment, the low-pressure section 120 may apply pressure that is less than that of the high-pressure section 100. For example, the low-pressure section may apply a pressure that is equal to one-half of the pressure of the high-pressure section 110 or less than one-half of the pressure of the high-pressure section 110.

During the separation of the carrier substrate 10, no pressure at all may be applied by the low-pressure section 120. However, when there is an extreme pressure difference, too much curl may be generated in the flexible display device during the separation of the carrier substrate 10, and thus, the low-pressure section 120 may apply some pressure, for example, a pressure that is less than or equal to one-half of the pressure of the high-pressure section 110 but is greater than 0, so as to flatten the flexible display device to some extent.

As illustrated in FIG. 4, there is a step difference 'd' between the high-pressure section 110 and the low-pressure section 120, and the step difference 'd' corresponds to a structure having a step difference with respect to the flexible substrate 20, which is formed due to a thickness of, for example, the protection layer 40.

Figure 5:
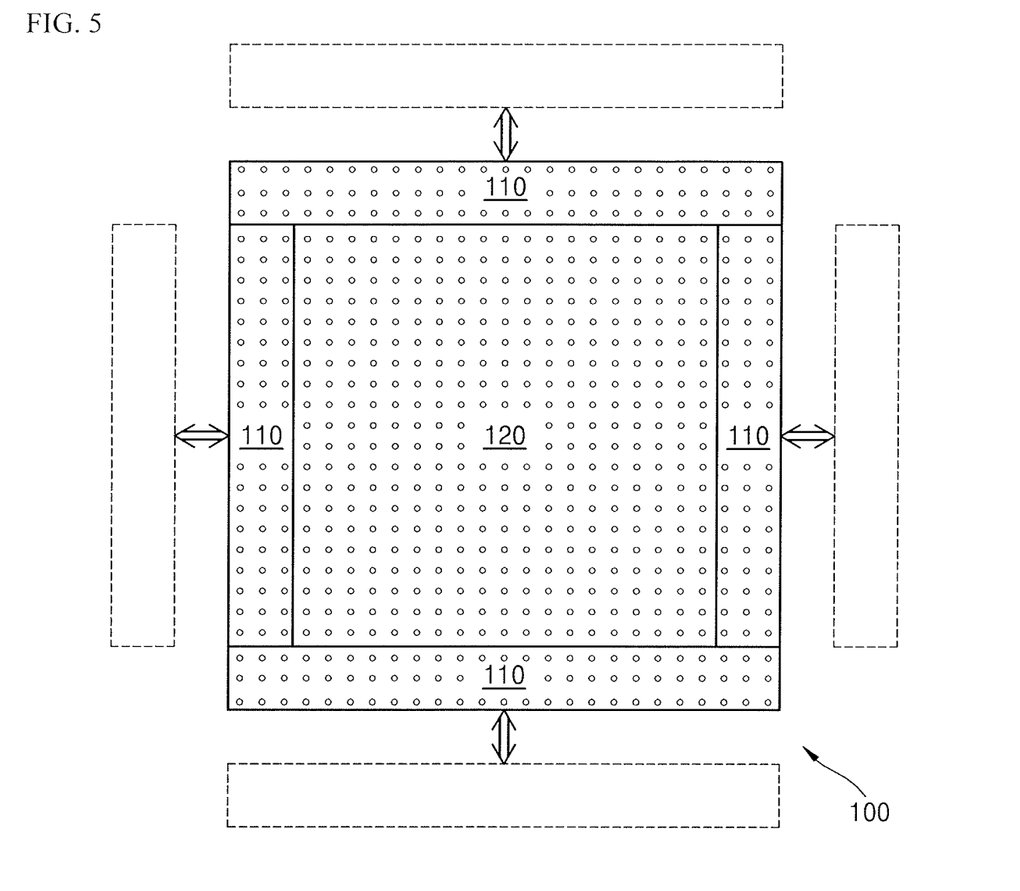
FIG. 5 illustrates a plan view of a first suction section of the apparatus of FIG. 3.

Referring to FIG. 5, the high-pressure sections 110 may be separate so that distances between the high-pressure sections 110 and the low-pressure section 120 can be adjusted with respect to the low-pressure section 120, which may be fixed at the center of the first suction section 100. In this case, when sizes of remaining edge portions of the flexible substrate 20, which are exposed and are to be sucked by the high-pressure sections 110, are changed, the positions of the high-pressure sections 110 may be adjusted according to the changed sizes.

Referring again to FIG. 3, the second suction section 200 may include a suction section 230 that sucks the carrier substrate 10 by driving a third pump P3, a reciprocating driver 210 that moves the suction section 230 in a direction in which the suction section 230 is to be detached from the flexible substrate 20, or in an opposite direction, and a tilt driver 220 that tilts the suction section 230 at an angle of, for example, about 5 degrees.

In an example embodiment, when the reciprocating driver 210 pulls the suction section 230 while the suction section 230 is sucking the carrier substrate 10, the carrier substrate 10 may be separated from the flexible substrate 20 in a state in which the carrier substrate 10 is parallel to the flexible substrate 20. When the tilt driver 220 tilts the suction section 230 in order to tilt the carrier substrate 10, a gap between the carrier substrate 10 and the flexible substrate may be gradually generated from one end towards the other end, and the carrier substrate 10 may be separated from the flexible substrate. Thus, the carrier substrate 10 and the flexible substrate 20 may be separated from each other by using only the reciprocating driver 210, or using the reciprocating driver 210 and the tilt driver 220.

The cutter 300 may be used to cut the outermost edge portions of the flexible substrate 20, and may include, for example, a cutting wheel 310 directly contacting the flexible substrate 20 to cut the same, a laser irradiator 320 that irradiates laser beams onto the flexible substrate 20 to cut the same without directly contacting the flexible substrate 20, etc.

An example manufacturing processes using the apparatus for manufacturing the flexible display device having the above-described structure may be performed as illustrated in FIGS. 6A to 6F.

Figure 6A:
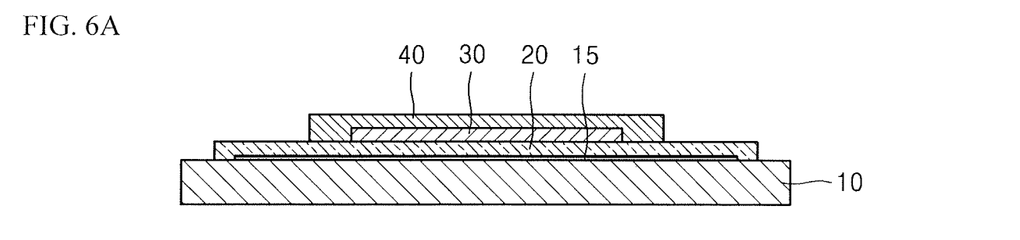
FIGS. 6A to 6F illustrate stages in a process of separating a carrier substrate by using the apparatus of FIG. 3.

Referring to FIG. 6A, the low-adhesive layer 15 may be formed on the carrier substrate 10 including a glass material, and then the flexible substrate 20 may be formed by, for example, spreading polyimide on the carrier substrate 10. Then, the display 30 and the protection layer 40 may be sequentially formed on the flexible substrate 20. In an implementation, the protection layer 40 may cover the display 30 in an area of the flexible substrate 20 such that, when viewed from the top of FIG. 6A, the edge portions of the flexible substrate 20 are not covered by the protection layer 40 and exposed (see FIG. 1).

Figure 6B:
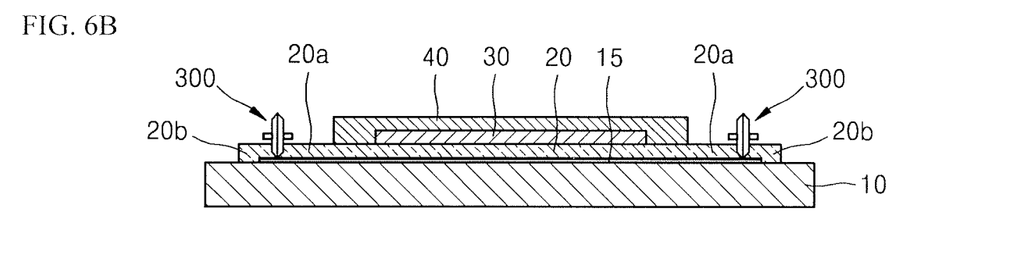

Next, a process of separating the carrier substrate 10 from the flexible substrate 20 may be performed. Referring to FIG. 6B, the outermost edge portions of the flexible substrate 20, that is, the portions directly contacting the carrier substrate 10 outside the low-adhesive layer 15, may be cut by the cutter 300. Thus, the exposed edge portions of the flexible substrate 20 may be divided into removed portions 20b that are cut away, and remaining portions 20a. The removed portions 20b may be portions, most of which directly contact the carrier substrate 10 without the low-adhesive layer 15, and are removed together with the carrier substrate 10 later.

Figure 6C:
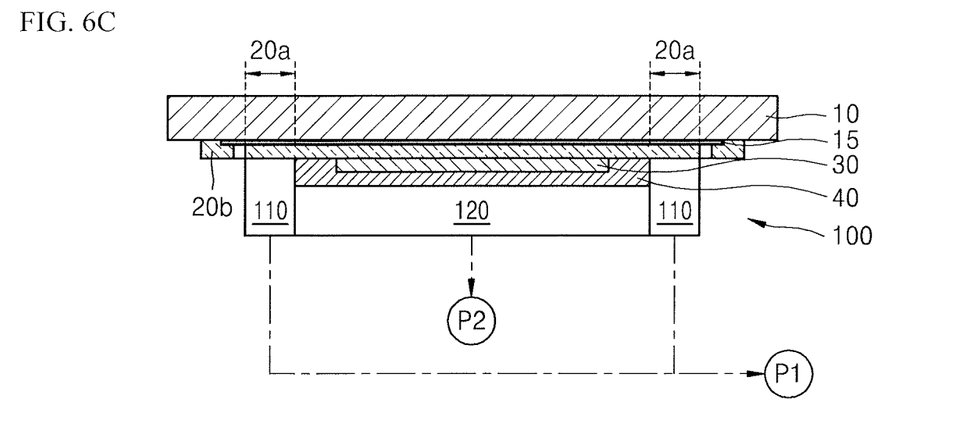

Referring to FIG. 6C, a target for which the cutting has completed may be fixed by the first suction section 100, as illustrated in FIG. 6C. Thus, sides of the protection layer 40 may be sucked by and fixed to the first suction section 100, and the protection layer 40 may be sucked by the low-pressure section 120 of the first suction section 100 at low negative pressure. The remaining portions 20a of the flexible substrate 20, which are exposed outside the protection layer 40, may be sucked by and fixed to the high-pressure sections 110 at high negative pressure. When there is a need to adjust the locations of the high-pressure sections 110 due to a size difference of the flexible substrate 20, the high-pressure sections 110 may be moved to adjust the distances between the high-pressure sections 110 and the low-pressure section 120, as illustrated in FIG. 5.

Figure 6D:
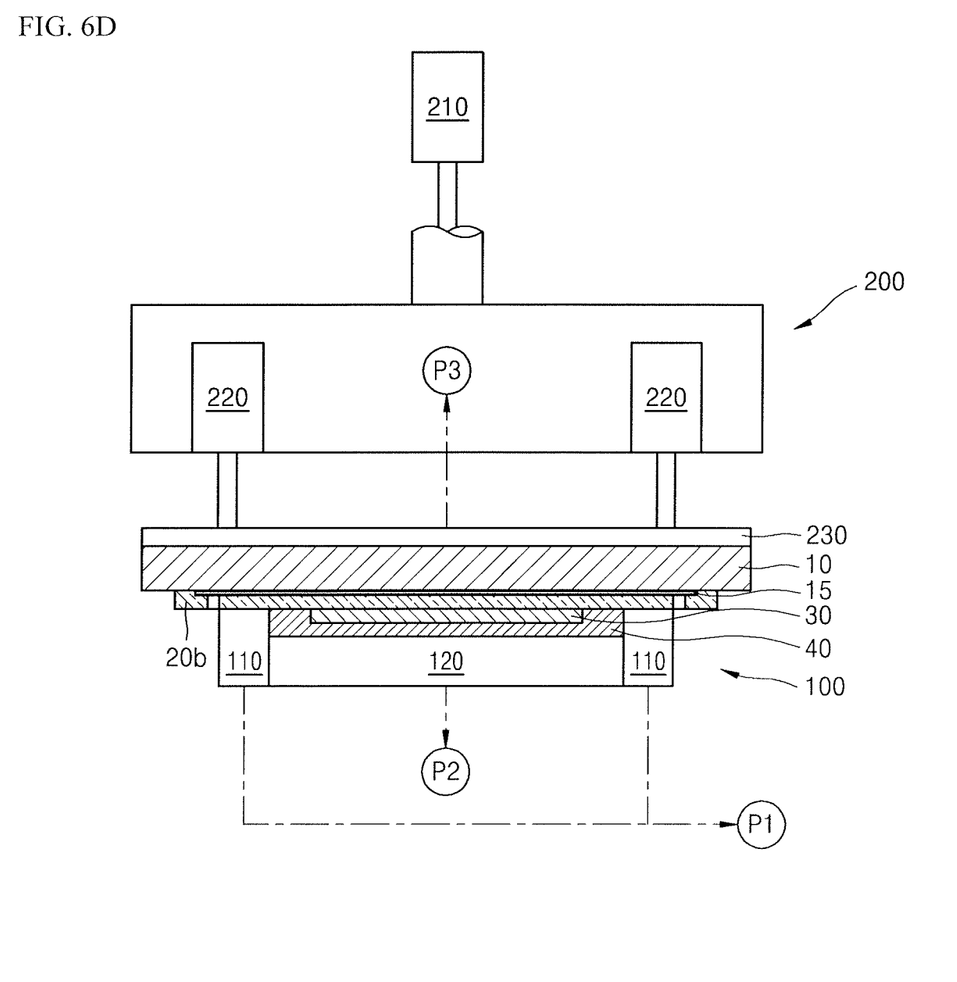

Referring to FIG. 6D, the second suction section 200 may be moved downwards by the reciprocating driver 210 and suck the carrier substrate 10 by using the suction section 230. When the first suction section 100 and the second suction section 200 are spread apart, the carrier substrate 10 may be separated from the flexible substrate 200. In this case, as described above, the carrier substrate 10 may be separated from the flexible substrate 200 while being parallel to the flexible substrate 20. In another implementation, the carrier substrate 10 may be tilted to be gradually separated from the flexible substrate 20.

Figure 6E:
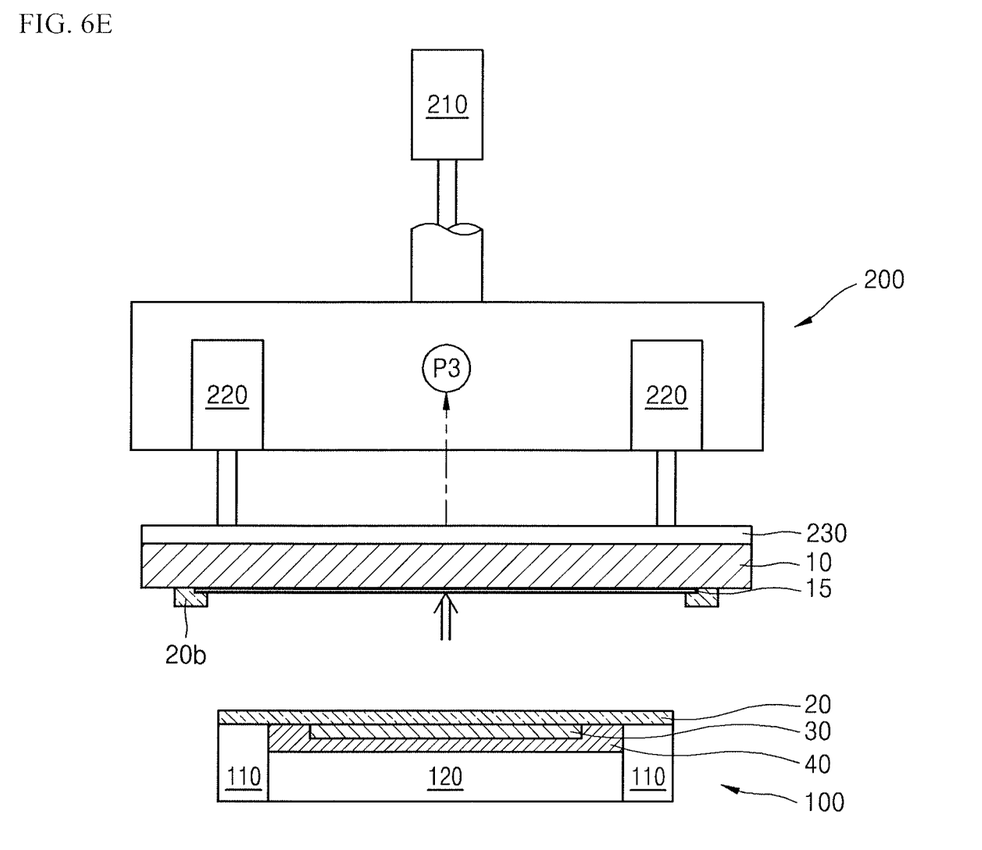

Referring to FIG. 6E, the carrier substrate 10 may be lifted while being parallel to the flexible substrate 20. In a state in which the suction section 230 sucks the carrier substrate 10, only the reciprocating driver 210, not the tilt driver 220, may be driven to pull the carrier substrate 10 in an opposite direction to a direction in which the suction power of the first suction section 100 is applied. Then, the entire carrier substrate 10 may be substantially simultaneously detached from the flexible substrate 20.

Figure 6F:
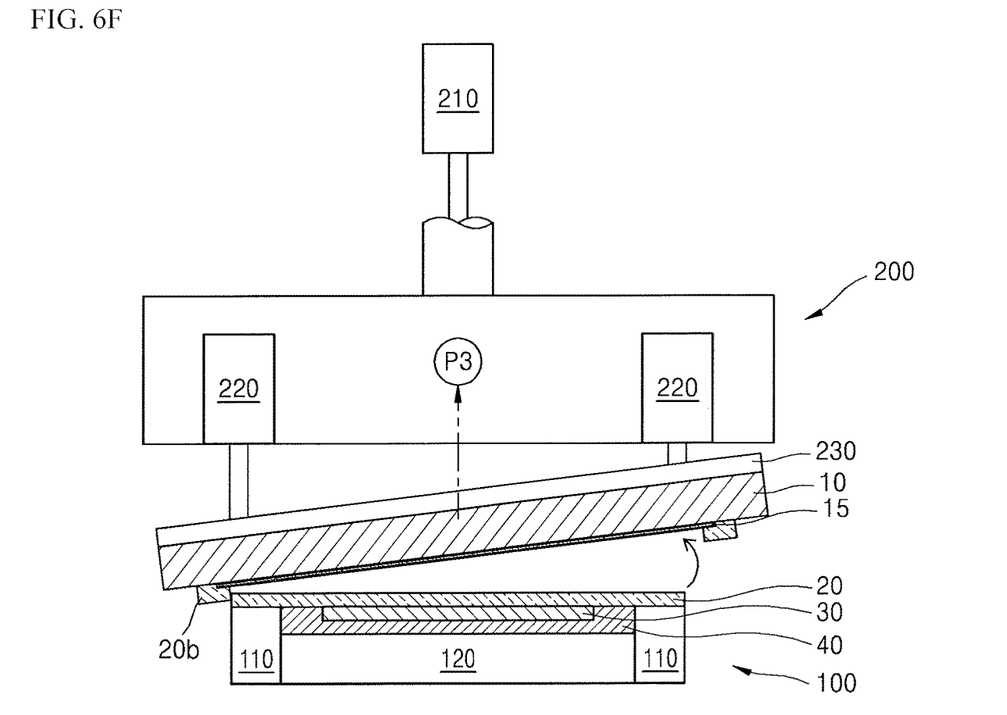

In another implementation, referring to FIG. 6F, the tilt driver 200 may be driven to tilt the suction section 230 first so as to tilt the carrier substrate 10 at an angle of, for example, about 5 degrees. Then, the carrier substrate 10 may be gradually detached from the flexible substrate 20 from one end of the carrier substrate 10 towards the other end thereof. In this state, the reciprocating driver 210 may be additionally driven to completely separate the carrier substrate 10 from the flexible substrate 20.

While the carrier substrate 10 is pulled by the second suction section 200 to be separated from the flexible substrate 20, the first suction section 100 may strongly suck the remaining edge portions 20*a* of the flexible substrate 20 and hold the same, and thus the separation of the carrier substrate 10 may be stably performed. Although the negative pressure of the low-pressure section 120 is applied to the protection layer 40, the applied negative pressure may be merely enough so that the flexible display device does not overly crumple during the separation of the carrier substrate 10, as described above. With negative pressure, which firmly holds the flexible substrate 20 during actual separation of the carrier substrate 10, applied to the remaining edge portions 20*a* by the high-pressure sections 110, exfoliation of the protection layer 40 during the separation may be prevented.

As described above, as illustrated in FIG. 6E or 6F, the carrier substrate 10 may be stably and neatly separated, and the display 30 and the protection layer 40 formed on the flexible substrate 20 may remain clean because exfoliation is prevented.

Accordingly, when the carrier substrate 10 is separated while the remaining edge portions 20*a* of the flexible substrate 20 are strongly sucked by the first suction section 100, the separation of the carrier substrate 10 may be smoothly performed without problems such as exfoliation of the protection layer 40 or generation of curls in the flexible display device.

According to the one or more embodiments, the cutting wheel 310 of FIG. 6B may be used to cut the outermost edge portions of the flexible substrate 20. In another implementation, the laser irradiator 320 of FIG. 3 may be used to cut the outermost edge portions by irradiating laser beams thereto. In this case, the laser beams may be directly irradiated onto the flexible substrate 20 or onto an opposite surface of the flexible substrate 20 so that the laser beams may penetrate the carrier substrate 10. Thus, a direction in which the laser beams are irradiated may vary.

By way of summation and review, a flexible display device may include a display formed on a flexible substrate. When a flexible display device is manufactured, in general, a flexible substrate may be formed by spreading a flexible material such as polyimide on a rigid carrier substrate including a glass material, a display may be formed on the flexible substrate, and then the carrier substrate and the flexible substrate may be separated from each other. It is desirable that the carrier substrate and the flexible substrate be smoothly separated from each other such that, for example, a protection film on the display (on an opposite side to the carrier substrate), is not exfoliated. In a general operation to separate of the carrier substrate, the carrier substrate may be pulled from the flexible substrate while the protection layer is being sucked and fixed, but in this case, separation of the protection film instead of the carrier substrate may occur, resulting in a defective product.

As described above, embodiments relate to a method and apparatus for manufacturing a flexible display device that may ensure smooth separation of a carrier substrate from a flexible substrate. According to example embodiments, the method and apparatus for manufacturing the flexible display apparatus may stably and neatly separate a carrier substrate from a flexible substrate. As a result, productivity may be improved, and a risk of damage to products may decrease.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a flexible display apparatus, the method comprising:
    forming a flexible substrate on a carrier substrate;
    forming a display on a central portion of the flexible substrate;
    forming a protection layer covering the display, within an area of the flexible substrate, such that an edge portion of the flexible substrate is exposed outside of the protection layer;
    cutting a first edge portion of the flexible substrate that is exposed outside of the protection layer, except for a second remaining portion of the flexible substrate that is exposed outside of the protection layer;
    applying suction to the second portion of the flexible substrate; and
    separating the carrier substrate from the flexible substrate.

2. The method as claimed in claim 1, further comprising forming a low-adhesive layer between the carrier substrate and the flexible substrate.

3. The method as claimed in claim 2, wherein the low-adhesive layer has an adhesion ranging from about 1 gf/inch to about 5 gf/inch.

4. The method as claimed in claim 1, further comprising applying lower suction to the protection layer when the suction is applied to the second portion of the flexible substrate.

5. The method as claimed in claim 4, wherein the suction applied to the protection layer is less than or equal to half of the suction applied to the second portion of the flexible substrate.

6. The method as claimed in claim 1, further comprising adjusting a location where the suction is applied to the second portion of the flexible substrate.

7. The method as claimed in claim 1, wherein, in the separating of the carrier substrate, the carrier substrate is pulled so as to be separated from the flexible substrate while being held parallel to the flexible substrate.

8. The method as claimed in claim 1, wherein, in the separating of the carrier substrate, one end of the carrier substrate is pulled first to separate the carrier substrate from the flexible substrate from the one end of the carrier substrate towards another end of the carrier substrate.

9. The method as claimed in claim 1, wherein the cutting of the edge portion is performed by using any one of contact cutting using a cutting wheel and non-contact cutting using a laser beam.

10. The method as claimed in claim 1, wherein the flexible substrate includes a polyimide material, and the carrier substrate includes a glass material.

11. An apparatus for manufacturing a flexible display device having a protection layer covering a display on a flexible substrate, the apparatus comprising:
a first suction section configured to apply suction to the protection layer; and
a second suction section configured to apply suction to a carrier substrate, which is coupled to the flexible substrate, on a side opposite to the display and pull and separate the carrier substrate from the flexible substrate,
wherein the first suction section includes:
a low-pressure section configured to apply relatively low suction to the protection layer over the display; and
a high-pressure section configured to apply relatively high suction to an edge portion of the flexible substrate extending beyond the display and exposed outside the protection layer.

12. The apparatus as claimed in claim 11, wherein the high-pressure section is separate from the low-pressure section, and distances between the high-pressure section and the low-pressure section are adjustable.

13. The apparatus as claimed in claim 11, wherein the second suction section includes:
a reciprocating driver configured to move the carrier substrate in a direction in which the suction power of the first suction section is applied, and in an opposite direction; and
a tilt driver configured to pull one side of the carrier substrate to tilt the carrier substrate.

14. The apparatus as claimed in claim 11, further comprising a cutter configured to cut edge portions of the flexible substrate.

15. The apparatus as claimed in claim 14, wherein the cutter includes any one of a cutting wheel and a laser irradiator.

16. The apparatus as claimed in claim 11, wherein a low-adhesive layer is arranged between the carrier substrate and the flexible substrate, and when the carrier substrate is separated from the flexible substrate by the first and second suction sections, the low-adhesive layer is separated from the flexible substrate together with the carrier substrate.

17. The apparatus as claimed in claim 16, wherein the low-adhesive layer has an adhesion ranging from about 1 gf/inch to about 5 gf/inch.

18. The apparatus as claimed in claim 11, wherein the suction of the low-pressure section is less than or equal to half of the suction of the high-pressure section.

19. The apparatus as claimed in claim 11, wherein the suction of the high-pressure section is in inverse proportion to an area of the edge portion.

20. The apparatus as claimed in claim 11, wherein the flexible substrate includes a polyimide material, and the carrier substrate includes a glass material.

* * * * *